(12) United States Patent
Kawaguchi et al.

(10) Patent No.: US 9,061,938 B2
(45) Date of Patent: *Jun. 23, 2015

(54) ALKALI-FREE GLASS

(75) Inventors: Takahiro Kawaguchi, Shiga (JP); Shinkichi Miwa, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 17 days.

This patent is subject to a terminal disclaimer.

(21) Appl. No.: 13/883,335

(22) PCT Filed: Oct. 26, 2011

(86) PCT No.: PCT/JP2011/074632
§ 371 (c)(1),
(2), (4) Date: May 30, 2013

(87) PCT Pub. No.: WO2012/063643
PCT Pub. Date: May 18, 2012

(65) Prior Publication Data
US 2013/0237401 A1 Sep. 12, 2013

Related U.S. Application Data

(60) Provisional application No. 61/411,030, filed on Nov. 8, 2010.

(51) Int. Cl.
  C03C 3/087 (2006.01)
  C03C 3/091 (2006.01)
  H05B 33/02 (2006.01)
  H01L 51/00 (2006.01)

(52) U.S. Cl.
  CPC .......... *C03C 3/087* (2013.01); *C03C 3/091* (2013.01); *H01L 51/0096* (2013.01); *H05B 33/02* (2013.01)

(58) Field of Classification Search
  CPC .......... C03C 3/87; C03C 3/91; H01L 51/0096
  USPC .................................................. 501/66, 70
  See application file for complete search history.

(56) References Cited

U.S. PATENT DOCUMENTS

| | | | | |
|---|---|---|---|---|
| 4,693,987 | A * | 9/1987 | Danielson | 501/70 |
| 5,489,558 | A * | 2/1996 | Moffatt et al. | 501/69 |
| 5,508,237 | A | 4/1996 | Moffatt et al. | |
| 6,069,100 | A * | 5/2000 | Naumann et al. | 501/67 |
| 6,373,193 | B1 | 4/2002 | Marlor et al. | |
| 6,846,760 | B2 * | 1/2005 | Siebers et al. | 501/32 |
| 7,553,786 | B2 * | 6/2009 | Fechner et al. | 501/70 |
| 7,563,737 | B2 * | 7/2009 | Fechner et al. | 501/70 |
| 2003/0184211 | A1 | 10/2003 | Hueber et al. | |
| 2004/0018934 | A1 | 1/2004 | Ott et al. | |
| 2005/0181926 | A1 * | 8/2005 | Fechner et al. | 501/70 |
| 2010/0045164 | A1 | 2/2010 | Fechner et al. | |
| 2013/0244859 | A1 | 9/2013 | Kawaguchi et al. | |

FOREIGN PATENT DOCUMENTS

| | | |
|---|---|---|
| CN | 1269910 | 10/2000 |
| CN | 101012104 | 8/2007 |
| DE | 102 14 449 | 10/2003 |
| EP | 2 607 326 | 6/2013 |
| JP | 63-69732 | 3/1988 |
| JP | 01-126239 | 5/1989 |
| JP | 10-45422 | 2/1998 |
| JP | 11-217235 | 8/1999 |
| JP | 2001-172041 | 6/2001 |
| JP | 2005-172881 | 6/2005 |
| JP | 3804112 | 8/2006 |
| JP | 2007-254283 | 10/2007 |
| JP | 2010-132541 | 6/2010 |
| JP | 2010-215463 | 9/2010 |
| WO | 99/14794 | 3/1999 |
| WO | 2006/072449 | 7/2006 |

OTHER PUBLICATIONS

International Preliminary Report on Patentability and Written Opinion of the International Searching Authority mailed May 23, 2013 in International (PCT) Application No. PCT/JP2011/074632.
Extended European Search Report issued May 8, 2014 in corresponding European Patent Application No. 11839493.1.
Database WPI, Week 199817, Thomson Scientific, London, GB; AN 1998-189026 XP002723606, -& JP H10-45422 A (Asahi Glass Co., Ltd.) Feb. 17, 1998, paragraph [0037], examples 1-9; table 2.
International Search Report issued Jan. 24, 2012 in International (PCT) Application No. PCT/JP2011/074632.
Chinese Office Action dated Sep. 25, 2014 issued in corresponding Chinese Patent Application No. 201180053066.1 (with English Translation).

* cited by examiner

*Primary Examiner* — Karl Group
(74) *Attorney, Agent, or Firm* — Wenderoth, Lind & Ponack, L.L.P.

(57) ABSTRACT

Provided is an alkali-free glass, comprising, as a glass composition in terms of mass %, 58 to 70% of $SiO_2$, 15.5 to 20% of $Al_2O_3$, 0 to 1% of $B_2O_3$, 0 to 5% of MgO, 3.5 to 16% of CaO, 0.5 to 6.5% of SrO, and 5 to 15% of BaO, being substantially free of alkali metal oxides, and having a strain point of more than 725° C.

10 Claims, No Drawings

ALKALI-FREE GLASS

This application is a U.S. National Stage Application of International (PCT) Application PCT/JP2011/074632 filed on Oct. 26, 2011, which claims the benefit of U.S. Provisional Application No. 61/411,030 filed on Nov. 8, 2010.

TECHNICAL FIELD

The present invention relates to an alkali-free glass, and more particularly, to an alkali-free glass suitable for an OLED display.

BACKGROUND ART

Electronic devices such as an OLED display, which are thin, excellent in movie display performance, and low in power consumption, are used for applications such as a display for a portable phone.

A glass sheet is widely used as a substrate for an OLED display. A glass sheet used for this application needs to have the following main characteristics.
(1) To be substantially free of alkali metal oxides in order to prevent alkali ions from diffusing in a semiconductor film formed in a heat treatment process.
(2) To be excellent in productivity, particularly in denitrification resistance and meltability, in order to produce a glass sheet at low cost.
(3) To have a high strain point in order to reduce heat shrinkage of a glass sheet in a production process of a p-Si.TFT.

In recent years, in addition to the needs, there have been increasing needs for, for example, reductions in weight and thickness and an increase in flexibility of a display.

CITATION LIST

Patent Literature 1: JP 3804112 B2

SUMMARY OF INVENTION

Technical Problem

Chemical etching is generally used for reducing a thickness of a display. This is a method of immersing a display panel, which is produced by attaching two glass sheets to each other, to reduce thicknesses of the glass sheets.

However, there has been a problem in that a conventional glass sheet for a display shows a very low etching rate because of its high resistance to a hydrofluoric acid-based chemical liquid. When a concentration of hydrofluoric acid in the chemical liquid is raised in order to increase the etching rate, an amount of fine particles insoluble in the hydrofluoric acid-based chemical liquid becomes larger. As a result, these fine particles are liable to adhere to a surface of the glass sheet, so that uniformity of etching is impaired in the surface of the glass sheet.

In order to solve the problem, studies have been made on a method of increasing an etching rate with respect to a hydrofluoric acid-based chemical liquid by reducing a content of $B_2O_3$ in a glass composition. For example, Patent Literature 1 discloses an alkali-free glass containing 0 to 1.5 mol % of $B_2O_3$. However, the alkali-free glass disclosed in Patent Literature 1, which has low devitrification resistance, is liable to denitrify when being formed, and hence is hardly produced. Further, in order to enhance devitrification resistance of the alkali-free glass, it is necessary to reduce a content of $Al_2O_3$, but in this case, a strain point of the resultant glass sheet lowers, and consequently, heat shrinkage of the glass sheet increases in a production process of a p-Si.TFT. Therefore, it is difficult to attain both of a high strain point and high devitrification resistance in the alkali-free glass disclosed in Patent Literature 1.

Thus, a technical object of the present invention is to devise an alkali-free glass which is excellent in productivity (particularly in devitrification resistance), has a high etching rate with respect to a hydrofluoric acid-based chemical liquid, and has a high strain point, thereby reducing a production cost of a glass sheet, improving throughput in a production process of a thin display panel, and reducing heat shrinkage of a glass sheet in a production process of a p-Si.TFT.

Solution to Problem

The inventors of the present invention have repeatedly performed various experiments. As a result, the inventors have found that the technical object can be achieved by restricting a range of a glass composition of an alkali-free glass strictly and restricting glass properties within a predetermined range. Thus, the inventors propose the finding as the present invention. That is, an alkali-free glass of the present invention comprises, as a glass composition in terms of mass %, 58 to 70% of $SiO_2$, 15.5 to 20% of $Al_2O_3$, 0 to 1% of $B_2O_3$, 0 to 5% of MgO, 3.5 to 16% of CaO, 0.5 to 6.5% of SrO, and 5 to 15% of BaO, is substantially free of alkali metal oxides, and has a strain point of more than 725° C. Here, the phrase "substantially free of alkali metal oxides" means that a content of alkali metal oxides ($Li_2O$, $Na_2O$, and $K_2O$) in a glass composition is 1000 ppm (by mass) or less. The strain point refers to a value obtained by measurement based on the method in accordance with ASTM C336.

The alkali-free glass of the present invention is preferably substantially free of $B_2O_3$. Here, the phrase "substantially free of $B_2O_3$" means that a content of $B_2O_3$ in a glass composition is 1000 ppm (by mass) or less.

The alkali-free glass of the present invention preferably further comprises 0.001 to 1 mass % of $SnO_2$ in the glass composition.

The alkali-free glass of the present invention preferably has a Young's modulus of more than 78 GPa. Note that the Young's modulus may be measured using a bending resonance method.

The alkali-free glass of the present invention preferably has a Young's modulus/density (specific Young's modulus) of more than 29.5 GPa/g·cm$^{-3}$. Note that the density may be measured by an Archimedes method.

The alkali-free glass of the present invention preferably has a liquidus temperature of less than 1250° C. Note that the "liquidus temperature" may be calculated by measuring a temperature at which crystals are deposited, under the condition that glass powders that passed through a standard 30-mesh sieve (500 μm) and remained on a 50-mesh sieve (300 μm) are placed in a platinum boat and then kept for 24 hours in a gradient heating furnace.

The alkali-free glass of the present invention preferably has a temperature at $10^{2.5}$ poise of 1660° C. or less.

The alkali-free glass of the present invention preferably has a viscosity at a liquidus temperature of $10^{4.8}$ poise or more. Note that the "viscosity at a liquidus temperature" may be measured by a platinum sphere pull up method.

The alkali-free glass of the present invention is preferably formed by an overflow down-draw method.

The alkali-free glass of the present invention may be used for an OLED device, in particular, an OLED display.

DESCRIPTION OF EMBODIMENTS

The reasons for restricting the content of each component as described above in an alkali-free glass of the present invention are described below. Note that the expression "%" refers to "mass %" in the description of the content of each component.

$SiO_2$ is a component that forms the network of glass. The content of $SiO_2$ is 58 to 70%, preferably 58 to 68%, more preferably 58 to 65%. When the content of $SiO_2$ is less than 58%, it becomes difficult to increase the strain point and the density becomes too high. On the other hand, when the content of $SiO_2$ is more than 70%, the viscosity of the glass becomes higher, the meltability lowers, devitrified crystals such as cristobalite are liable to precipitate, and the liquidus temperature becomes higher.

$Al_2O_3$ is a component that forms the network of glass, increases the strain point, and moreover, suppresses phase separation. The content of $Al_2O_3$ is 15.5 to 20%, preferably 15.5 to 19%, more preferably 15.5 to 18.5%. When the content of $Al_2O_3$ is less than 15.5%, the strain point lowers, and the glass is liable to undergo phase separation. On the other hand, when the content of $Al_2O_3$ is more than 20%, devitrified crystals such as mullite or anorthite are liable to precipitate, and the liquidus temperature becomes higher.

$B_2O_3$ is a component that enhances the meltability and enhances the denitrification resistance. The content of $B_2O_3$ is 0 to 1%, preferably 0 to 0.8%, more preferably 0 to 0.6%, still more preferably 0 to 0.4%, particularly preferably 0 to 0.2%, and it is most preferred that the glass be substantially free of $B_2O_3$. When the content of $B_2O_3$ is more than 1%, the strain point significantly lowers, and in addition, an etching rate with respect to a hydrofluoric acid-based chemical liquid becomes slower.

MgO is a component that lowers the viscosity and enhances the meltability. The content of MgO is 0 to 5%, preferably 0 to 4%, more preferably 0 to 3%, still more preferably 0 to 2%, particularly preferably 0.5 to 2%. When the content of MgO is more than 5%, the strain point significantly lowers.

CaO is a component that lowers the viscosity and remarkably enhances the meltability without lowering the strain point. CaO is also a component that contributes to reducing raw material cost, because a raw material for introducing CaO is relatively inexpensive among alkaline-earth metal oxides. The content of CaO is 3.5 to 16%, preferably 4.5 to 16%, more preferably 5.5 to 15%, particularly preferably 6.5 to 10%. When the content of CaO is less than 3.5%, it becomes difficult to obtain the above effects. On the other hand, when the content of CaO is more than 16%, the glass is liable to denitrify and its thermal expansion coefficient becomes too high.

SrO is a component that suppresses the phase separation of glass and enhances the devitrification resistance. SrO is also a component that lowers the viscosity, enhances the meltability without lowering the strain point, and moreover, suppresses increase of the liquidus temperature. The content of SrO is 0.5 to 6.5%, preferably 0.5 to 6%, more preferably 0.5 to 5.5%, particularly preferably 1 to 4.5%. When the content of SrO is less than 0.5%, it becomes difficult to obtain the effects of suppressing the phase separation of the glass and of enhancing the devitrification resistance. On the other hand, when the content of SrO is more than 6.5%, strontium silicate-based devitrified crystals are liable to precipitate and devitrification resistance is liable to lower.

BaO is a component that remarkably enhances the devitrification resistance, among alkaline-earth metal oxides. The content of BaO is 5 to 15%, preferably 5 to 14%, more preferably 5 to 12%, particularly preferably 5.5 to 10.5%. When the content of BaO is less than 5%, the liquidus temperature becomes higher and the devitrification resistance lowers. On the other hand, when the content of BaO is more than 15%, the viscosity becomes too high, the meltability lowers, devitrified crystals containing BaO are liable to precipitate, and the liquidus temperature becomes higher.

In addition to above-mentioned components, the following components, for example, may be added in the glass composition. Note that the total content of the components except the above-mentioned components is preferably 10% or less, particularly preferably 5% or less, from the standpoint of obtaining the effects of the present invention.

$SnO_2$ is a component that has a good fining performance in a high temperature range, increases the strain point, and lowers the viscosity. The content of $SnO_2$ is preferably 0 to 1%, 0.001 to 1%, or 0.01 to 0.5%, or particularly preferably 0.05 to 0.3%. When the content of $SnO_2$ is more than 1%, a devitrified crystal of $SnO_2$ is liable to precipitate. Note that, when the content of $SnO_2$ is less than 0.001%, it becomes difficult to obtain the above effects.

As described above, $SnO_2$ is suitable as a fining agent. In addition, it is possible to add, as a fining agent, $F_2$, $Cl_2$, $SO_3$, C, or a powder of a metal such as Al or Si up to 5%, as long as the characteristics of glass are not impaired. Besides, it is also possible to add, as a fining agent, $CeO_2$ or the like up to 5%.

$As_2O_3$ and $Sb_2O_3$ are also effective as fining agents. It is not completely excluded that the alkali-free glass of the present invention contains these components, but it is preferred that these components be avoided when possible, from an environmental point of view. Further, when $As_2O_3$ is contained in a large amount, the solarization resistance tends to lower. Thus, the content of $As_2O_3$ is preferably 1% or less or 0.5% or less, particularly preferably 0.1% or less, and it is desirable that the glass be substantially free of $As_2O_3$. Here, the phrase "substantially free of $As_2O_3$" means that the content of $As_2O_3$ in the glass composition is less than 0.05%. Further, the content of $Sb_2O_3$ is preferably 2% or less or 1% or less, particularly preferably 0.5% or less, and it is desirable that the glass be substantially free of $Sb_2O_3$. Here, the phrase "substantially free of $Sb_2O_3$" means that the content of $Sb_2O_3$ in the glass composition is less than 0.05%.

Cl has an effect of facilitating melting of an alkali-free glass, and hence, when adding Cl, the melting temperature can be made lower, the performance of a fining agent is facilitated, and consequently, it is possible to attain the longer life of a glass production furnace while the melting cost is reduced. However, when the content of Cl is too large, the strain point lowers, and hence the content of Cl is preferably 3% or less or 1% or less, particularly preferably 0.5% or less. Note that it is possible to use, as a raw material for introducing Cl, a raw material such as a chloride of an alkaline-earth metal, for example, strontium chloride, or aluminum chloride.

ZnO is a component that enhances the meltability. However, when ZnO is contained in a large amount, the glass is liable to denitrify and the strain point is liable to lower. The content of ZnO is preferably 0 to 5%, 0 to 3%, or 0 to 0.5%, particularly preferably 0 to 0.3%, and it is desired that the glass be substantially free of ZnO. Here, the phrase "substantially free of ZnO" means that the content of ZnO in the glass composition is 0.2% or less.

$P_2O_5$ is a component that enhances the strain point. However, when $P_2O_5$ is contained in a large amount, the glass is liable to undergo phase separation. The content of $P_2O_5$ is preferably 0 to 1.5% or 0 to 1.2%, particularly preferably 0 to 1%.

$TiO_2$ is a component that lowers the viscosity, enhances the meltability, and suppresses the solarization. However, when $TiO_2$ is contained in a large amount, the glass is colored and the transmittance is liable to lower. The content of $TiO_2$ is preferably 0 to 5%, 0 to 3%, or 0 to 1%, particularly preferably 0 to 0.02%.

$Y_2O_3$, $Nb_2O_5$, and $La_2O_3$ have functions of increasing the strain point, the Young's modulus, and the like. However, when the content of each of these components is more than 5%, the density is liable to increase.

The alkali-free glass of the present invention has a strain point of more than 725° C., preferably 730° C. or more, more preferably 735° C. or more, still more preferably 740° C. or more. With such strain point, it is possible to suppress the heat shrinkage of the resultant glass sheet in the production process of a p-Si.TFT.

The alkali-free glass of the present invention has a Young's modulus of preferably more than 78 GPa, 79 GPa or more, 80 GPa or more, or 81 GPa or more, particularly preferably 82 GPa or more. With such Young's modulus, the deflection of the resultant glass sheet can be suppressed, and hence the glass sheet can be handled more easily in its production process or the like.

The alkali-free glass of the present invention has a Young's modulus/density of preferably more than 29.5 GPa/g·cm$^{-3}$, 30.0 GPa/g·cm$^{-3}$ or more, 30.5 GPa/g·cm$^{-3}$ or more, or 31.0 GPa/g·cm$^{-3}$ or more, particularly preferably 31.5 GPa/g·cm$^{-3}$ or more. The deflection of a glass sheet is also influenced by its density. When the Young's modulus/density is increased, the deflection of the resultant glass sheet can be significantly suppressed.

The alkali-free glass of the present invention has a liquidus temperature of preferably less than 1250° C., or 1240° C. or less, particularly preferably 1230° C. or less. With such liquidus temperature, a situation in which a devitrified crystal is generated during glass production to decrease productivity is easily prevented. Further, the glass can be easily formed into a glass sheet by an overflow down-draw method, with the result that the surface quality of the glass sheet can be improved, and the production cost of the glass sheet can be lowered. Note that liquidus temperature is an index of devitrification resistance, and as the liquidus temperature is lower, the glass is more excellent in devitrification resistance.

The alkali-free glass of the present invention has a temperature at $10^{2.5}$ poise of preferably 1660° C. or less or 1650° C. or less, particularly preferably 1640° C. or less. When the temperature at $10^{2.5}$ poise becomes high, the glass is difficult to be melted, and as a result, the production cost of a glass sheet soars. Note that the temperature at $10^{2.5}$ poise corresponds to the melting temperature, and as the temperature is lower, the glass is more excellent in meltability.

The alkali-free glass of the present invention has a viscosity at the liquidus temperature of preferably $10^{4.8}$ poise or more, $10^{5.0}$ poise or more, or $10^{5.2}$ poise or more, particularly preferably $10^{5.3}$ poise or more. With such liquidus viscosity, the devitrification of the glass hardly occurs during forming, and hence, the glass can be easily formed by an overflow down-draw method, with the result that the surface quality of the glass sheet can be enhanced, and the production cost of the glass sheet can be lowered. Note that liquidus viscosity is an index of formability, and as the liquidus viscosity is higher, the glass is more excellent in formability.

The alkali-free glass of the present invention is preferably formed by an overflow down-draw method. The overflow down-draw method refers to a method in which a molten glass is caused to overflow from both sides of a heat-resistant, trough-shaped structure, and the overflowing molten glasses are caused to join to each other at the lower end of the trough-shaped structure to be down-drawn, to thereby produce a glass sheet. When a glass sheet is produced by the overflow down-draw method, surfaces of the glass sheet are formed in a state of free surfaces without being brought into contact with the trough-shaped structure. As a result, it is possible to produce a glass sheet having a good surface quality without polishing at a low cost. Note that the structure and material of the trough-shaped structure used in the overflow down-draw method are not particularly limited as long as a desired dimension and surface accuracy of the resultant glass sheet can be obtained. Further, a means for applying a force to glass during performing down-draw downward is also not particularly limited. For example, there may be adopted a means in that heat-resistant rolls each having a sufficiently large width are rotated to be in contact with glass, to thereby draw the glass, or a method in that a plurality of pairs of heat-resistant rolls are rotated to be in contact with only the vicinities of end surfaces of the glass, to thereby draw the glass.

It is also possible to form a glass sheet by, for example, a down-draw method (slot down method, or the like), a float method, or the like, besides the overflow down-draw method.

The alkali-free glass of the present invention is preferably used for OLED devices, in particular, for OLED displays. In panel makers producing OLED displays, a plurality of devices are formed on a large-size glass sheet which is produced by a glass maker, and then the large-size glass sheet is divided into small-size glass sheets each of which is formed with the individual device, in order to reduce the production cost (so-called Gang Printing). Large-size devices are common particularly for TV application, and a large-size glass sheet is demanded to perform Gang Printing of these devices. The alkali-free glass of the present invention has a low liquidus temperature and a high liquidus viscosity and can be easily formed into a large-size glass sheet, thus, is able to satisfy such demand.

The alkali-free glass of the present invention has a thickness (sheet thickness) of preferably 0.7 mm or less, 0.5 mm or less, 0.4 mm or less, or 0.3 mm or less, particularly preferably 0.1 mm or less. As the thickness is smaller, reductions in weight and thickness and an increase in flexibility of a display can be more easily achieved.

EXAMPLES

Hereinafter, the present invention is described with reference to examples. However, the following examples are merely examples, and the present invention is by no means limited thereto.

Tables 1 and 2 show examples of the present invention (Sample Nos. 1 to 7) and comparative examples (Sample Nos. 8 to 10).

TABLE 1

| | | Example | | | | | | |
|---|---|---|---|---|---|---|---|---|
| | | No. 1 | No. 2 | No. 3 | No. 4 | No. 5 | No. 6 | No. 7 |
| Glass composition (wt %) | $SiO_2$ | 63.4 | 63.4 | 63.4 | 63.4 | 61.5 | 61.5 | 62.5 |
| | $Al_2O_3$ | 15.9 | 15.9 | 15.9 | 15.9 | 17.9 | 15.8 | 16.2 |
| | $B_2O_3$ | — | — | — | — | 1.0 | — | 0.5 |
| | MgO | — | 2.0 | — | 2.0 | 3.7 | — | 2.0 |
| | CaO | 9.4 | 7.4 | 11.4 | 10.4 | 3.8 | 9.5 | 7.8 |
| | SrO | 2.0 | 2.0 | 2.0 | 2.0 | 5.9 | 0.5 | 0.5 |
| | BaO | 9.0 | 9.0 | 7.0 | 6.0 | 5.9 | 12.4 | 10.2 |
| | $SnO_2$ | 0.3 | 0.3 | 0.3 | 0.3 | 0.3 | 0.3 | 0.3 |
| Density [g/cm³] | | 2.646 | 2.644 | 2.634 | 2.629 | 2.631 | 2.695 | 2.648 |
| CTE [×10⁻⁷/° C.] | | 44.9 | 43.4 | 46.1 | 45.1 | 40.4 | 46.4 | 43.3 |
| Young's modulus [GPa] | | 82.1 | 80.4 | 81.4 | 82.9 | 83.0 | 80.3 | 81.6 |
| Specific Young's modulus [GPa/g · cm⁻³] | | 31.0 | 30.4 | 30.9 | 31.5 | 31.5 | 29.8 | 30.8 |
| Ps [° C.] | | 755 | 740 | 750 | 735 | 735 | 745 | 735 |
| Ta [° C.] | | 810 | 800 | 800 | 790 | 785 | 800 | 790 |
| Ts [° C.] | | 1040 | 1030 | 1025 | 1010 | 1020 | 1025 | 1020 |
| 10⁴ poise [° C.] | | 1365 | 1365 | 1335 | 1315 | 1340 | 1345 | 1345 |
| 10³ poise [° C.] | | 1540 | 1535 | 1505 | 1480 | 1505 | 1510 | 1515 |
| 10^{2.5} poise [° C.] | | 1655 | 1640 | 1610 | 1585 | 1605 | 1625 | 1620 |
| TL [° C.] | | 1215 | 1220 | 1215 | 1215 | 1230 | 1185 | 1210 |
| $Log_{10}\eta TL$ | | 5.3 | 5.2 | 5.0 | 4.9 | 4.9 | 5.4 | 5.2 |

TABLE 2

| | | Comparative Example | | |
|---|---|---|---|---|
| | | No. 8 | No. 9 | No. 10 |
| Glass composition (wt %) | $SiO_2$ | 61.4 | 61.0 | 64.8 |
| | $Al_2O_3$ | 17.9 | 18.0 | 16.6 |
| | $B_2O_3$ | — | 2.0 | 0.2 |
| | MgO | — | 3.0 | 0.2 |
| | CaO | 15.4 | 7.0 | 13.4 |
| | SrO | — | 2.0 | 2.0 |
| | BaO | 5.0 | 6.7 | 2.5 |
| | $SnO_2$ | 0.3 | 0.3 | 0.3 |
| Density [g/cm³] | | 2.631 | 2.609 | 2.578 |
| CTE [×10⁻⁷/° C.] | | 48.2 | 41.2 | 45.2 |
| Young's modulus [GPa] | | 83.7 | 82.3 | 83.3 |
| Specific Young's modulus [GPa/g · cm⁻³] | | 31.8 | 31.5 | 32.3 |
| Ps [° C.] | | 750 | 720 | 750 |
| Ta [° C.] | | 800 | 775 | 805 |
| Ts [° C.] | | 1005 | 1005 | 1020 |
| 10⁴ poise [° C.] | | 1290 | 1315 | 1320 |
| 10³ poise [° C.] | | 1445 | 1475 | 1480 |
| 10^{2.5} poise [° C.] | | 1545 | 1580 | 1585 |
| TL [° C.] | | >1250 | 1205 | >1250 |
| $Log_{10}\eta TL$ | | — | 5.0 | — |

First, a glass batch prepared by blending glass raw materials so that each glass composition listed in the tables was attained was placed in a platinum crucible, and then the glass batch was melted at 1600 to 1650° C. for 24 hours. The glass batch was melted while being stirred by a platinum stirrer to be homogenized. Next, the molten glass was poured on a carbon sheet and was formed into a sheet-shaped glass, followed by annealing for 30 minutes at a temperature close to the annealing point. Each of the resultant samples was evaluated for its density, average thermal expansion coefficient CTE in the temperature range of 30 to 380° C., Young's modulus, Young's modulus/density (specific Young's modulus), strain point Ps, annealing point Ta, softening point Ts, temperature at a viscosity of 10⁴ poise, temperature at a viscosity of 10³ poise, temperature at a viscosity of 10^{2.5} poise, liquidus temperature TL, and viscosity at the liquidus temperature (liquidus viscosity $Log_{10} \eta TL$).

The density is a value obtained by measurement by the well-known Archimedes method.

The average thermal expansion coefficient CTE in the temperature range of 30 to 380° C. is a value obtained by measurement using a dilatometer.

The Young's modulus is a value obtained by measurement using a bending resonance method.

The Young's modulus/density (specific Young's modulus) is a value obtained by dividing the Young's modulus obtained by measurement using the bending resonance method by the density obtained by measurement using the Archimedes method.

The strain point Ps, the annealing point Ta, and the softening point Ts are values obtained by measurement based on the method of ASTM C336.

The temperatures at viscosities of 10⁴ poise, 10³ poise, and 10^{2.5} poise are values obtained by measurement by a platinum sphere pull up method.

The liquidus temperature TL is a value obtained by measuring a temperature at which crystals are deposited, under the condition that glass powders that passed through a standard 30-mesh sieve (500 μm) and remained on a 50-mesh sieve (300 μm) are placed in a platinum boat and then kept for 24 hours in a gradient heating furnace.

The viscosity at the liquidus temperature (liquidus viscosity $Log_{10} \eta TL$) is a value obtained by measurement using a platinum sphere pull up method.

As is clear from Table 1, each of Sample Nos. 1 to 7 was free of alkali metal oxides and had a strain point of more than 725° C. and a liquidus temperature of 1250° C. or less. Thus, the heat shrinkage of the glass sheet of each of Sample Nos. 1 to 7 becomes hard to occur in the heat treatment process of a p-Si.TFT and its productivity is good. Further, the content of $B_2O_3$ is 0 to 1 mass % in each of Sample Nos. 1 to 7, which allows an improved throughput in the production process of a thin display panel. Thus, it is expected that Sample Nos. 1 to 7 can each be suitably used as a glass sheet for an OLED display.

On the other hand, each of Sample Nos. 8 and 10 has a high liquidus temperature and low denitrification resistance, and hence its formability is inferior. Further, Sample No. 9 has a low strain point, and hence the heat shrinkage of the glass sheet of Sample No. 9 becomes large in the heat treatment process of a p-Si.TFT, thus possibly causing a display defect of a TFT due to pixel pitch shift.

INDUSTRIAL APPLICABILITY

The alkali-free glass of the present invention can be suitably used for, for example, a flat panel display substrate for a liquid crystal display, an OLED display, or the like, a cover glass for an image sensor such as a charge coupled device (CCD) or a contact image sensor (CIS), a substrate and cover glass for a solar cell, and a substrate for an OLED lighting device, and in particular, can be suitably used as a glass sheet for a OLED display.

The invention claimed is:

1. An alkali-free glass, comprising, as a glass composition in terms of mass %, 62.5 to 70% of $SiO_2$, 15.5 to 20% of $Al_2O_3$, 0 to 1% of $B_2O_3$, 0 to 5% of MgO, 3.5 to 16% of CaO, 0.5 to 6.5% of SrO, and 5 to 15% of BaO, being substantially free of alkali metal oxides, and having a strain point of more than 735° C.

2. The alkali-free glass according to claim 1, wherein the alkali-free glass is substantially free of $B_2O_3$.

3. The alkali-free glass according to claim 1, further comprising 0.001 to 1 mass % of $SnO_2$ in the glass composition.

4. The alkali-free glass according to claim 1, wherein the alkali-free glass has a Young's modulus of more than 78 GPa.

5. The alkali-free glass according to claim 1, wherein the alkali-free glass has a Young's modulus/density of more than 29.5 GPa/g·cm$^{-3}$.

6. The alkali-free glass according to claim 1, wherein the alkali-free glass has a liquidus temperature of less than 1250° C.

7. The alkali-free glass according to claim 1, wherein the alkali-free glass has a temperature at $10^{2.5}$ poise of 1660° C. or less.

8. The alkali-free glass according to claim 1, wherein the alkali-free glass has a viscosity at a liquidus temperature of $10^{4.8}$ poise or more.

9. The alkali-free glass according to claim 1, wherein the alkali-free glass is formed by an overflow down-draw method.

10. The alkali-free glass according to claim 1, wherein the alkali-free glass is used for an OLED display.

* * * * *